(12) United States Patent
Kim et al.

(10) Patent No.: US 7,388,286 B2
(45) Date of Patent: Jun. 17, 2008

(54) SEMICONDUCTOR PACKAGE HAVING ENHANCED HEAT DISSIPATION AND METHOD OF FABRICATING THE SAME

(75) Inventors: Sang-uk Kim, Asan-si (KR); Yun-hyeok Im, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 223 days.

(21) Appl. No.: 11/313,721

(22) Filed: Dec. 22, 2005

(65) Prior Publication Data
US 2006/0145316 A1 Jul. 6, 2006

(30) Foreign Application Priority Data
Jan. 5, 2005 (KR) .................. 10-2005-0000805

(51) Int. Cl.
*H01L 23/10* (2006.01)
(52) U.S. Cl. ............... 257/706; 257/707; 257/712; 257/713; 257/796; 257/E33.075; 257/E31.131; 257/E23.051; 257/E23.08; 257/E23.082; 257/E23.101; 257/E23.109

(58) Field of Classification Search ............... 257/706, 257/707, 796, E33.075, E31.131, E23.051, 257/E23.08–E23.113, 276, 625, 675, 712–722; 438/122, FOR. 413; 361/687, 688, 709–713
See application file for complete search history.

(56) References Cited

U.S. PATENT DOCUMENTS

| 5,184,211 | A | * | 2/1993 | Fox ........................... 257/706 |
| 5,786,635 | A | * | 7/1998 | Alcoe et al. ................ 257/718 |
| 6,046,498 | A | * | 4/2000 | Yoshikawa .................. 257/706 |
| 7,075,180 | B2 | * | 7/2006 | Narendra et al. ........... 257/707 |

FOREIGN PATENT DOCUMENTS

KR 1020000059991 A 10/2000
KR 1020030092538 A 12/2003

* cited by examiner

*Primary Examiner*—Jasmine J Clark
(74) *Attorney, Agent, or Firm*—Volentine & Whitt, PLLC

(57) ABSTRACT

A semiconductor package comprising a semiconductor chip and a first heat spreader adhered to the upper surface of the semiconductor chip is provided. The first heat spreader comprises a flat metal plate and a plurality of metal balls adhered to the flat metal plate. A method of fabricating the semiconductor chip package is also provided.

20 Claims, 6 Drawing Sheets

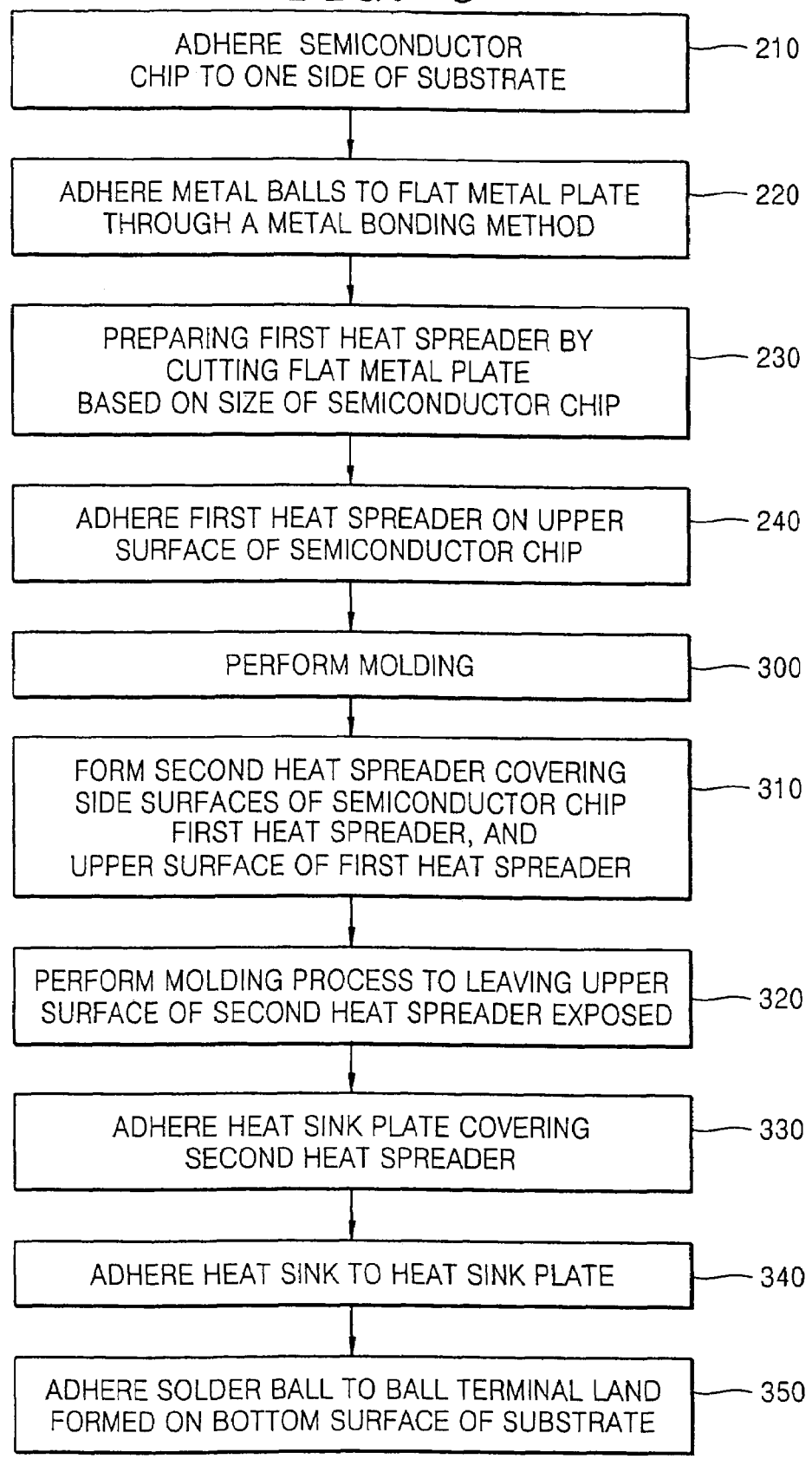

SEMICONDUCTOR PACKAGE HAVING ENHANCED HEAT DISSIPATION AND METHOD OF FABRICATING THE SAME

BACKGROUND OF THE INVENTION

1. Field of the Invention

The present invention relates to a semiconductor package and method of fabricating the same, and more particularly, to a semiconductor package having enhanced heat dissipation and method of fabricating the same.

This application claims priority to Korean Patent Application No. 2005-0000805, filed on Jan. 5, 2005, the subject matter of which is hereby incorporated by reference in its entirety.

2. Description of the Related Art

Although semiconductor device size has decreased over time, the number of input/output pins on a semiconductor device has risen dramatically, as has semiconductor device operational speed. Accordingly, semiconductor devices consume more electric power per unit volume, and generate more heat than they did previously. The heat generated greatly increases semiconductor chip temperature, which slows down semiconductor chip operating speed.

The heat generated by a semiconductor chip in a semiconductor package is dissipated to the exterior of the package mostly through a substrate, such as a printed circuit board (PCB), while the rest of the heat is absorbed by the area surrounding the semiconductor chip. However, the dramatic decrease in package size has limited the amount of heat that may effectively be dissipated through the substrate, so a large amount of heat remains in the area surrounding the semiconductor chip. Therefore, a heat spreader has been introduced into the semiconductor package to help the semiconductor chip dissipate heat.

FIG. 1 is a cross sectional view of a semiconductor package comprising a conventional heat spreader.

Referring to FIG. 1, the semiconductor package comprises a substrate 10, such as a printed circuit board (PCB). A circuit pattern is formed on one side of a substrate 10, and both sides of substrate 10 may be coated with a passivation layer 14, such as a photo solder resist layer. A semiconductor chip 22 comprising a plurality of bonding pads (not shown) is adhered to a top surface of substrate 10 by a non-metallic adhesive 20 such as an epoxy resin. Substrate 10 and semiconductor chip 22 are electrically coupled by a wire bonding 24. A ball terminal 16 is adhered to a ball terminal land 18 formed on a bottom surface of substrate 10. Reference symbol 12 denotes a generic illustration of a redistribution pattern. Redistribution pattern 12 electrically connects the plurality of bonding pads to ball terminal lands 18.

A heat spreader 28 is molded on semiconductor chip 22 with a molding material 26 that covers side surfaces and an upper surface of semiconductor chip 22. Heat spreader 28 may be completely covered by molding material 26, or it may be partially covered, exposing an upper surface of heat spreader 28, as shown in FIG. 1. Heat spreader 28 is formed from a material having relatively high heat conductivity such as aluminum or copper, and a surface of heat spreader 28 is black filmed by CuO or $Cu_2O$ to enhance heat dissipation.

A semiconductor package comprising a conventional heat spreader 28 has several problems. First, heat spreader 28 increases the weight of the package, and the weight increase may decrease the durability of the package, which may be weakened by physical shock. That is, the circuit pattern of the package may be easily cracked by the physical shock resulting from being dropped, for example. However, the weight of heat spreader 28 may not be one of the factors considered when maximizing the heat dissipation of a semiconductor package. Secondly, since conventional heat spreader 28 is adhered to substrate 10 with epoxy resin, conventional heat spreader 28 may cause a heat gradient between layers or elements within the package. The heat gradient may lead to cracking of layers or elements, such as a via, within the package during a heat reliability test conducted after increasing the heat stress of substrate 10. Thirdly, heat is indirectly dissipated through molding material 26, which has a relatively low heat conductivity, because heat spreader 28 is not connected directly to wire bonding 24.

SUMMARY OF THE INVENTION

In one embodiment, the invention provides a semiconductor package, comprising a semiconductor chip, and a substrate having a top surface and a bottom surface, wherein the semiconductor chip is formed on the top surface of the substrate, and wherein a ball terminal land is formed on the bottom surface of the substrate. The semiconductor package also comprises a first heat spreader comprising a flat metal plate, and a plurality of metal balls arranged on the flat metal plate, wherein the first heat spreader is adhered to an upper surface of the semiconductor chip. In addition the semiconductor package comprises a ball terminal adhered to the ball terminal land.

In another embodiment, the invention provides a semiconductor package module comprising a plurality of semiconductor chips, a plurality of first heat spreaders, wherein each of the plurality of first heat spreaders is adhered to one of the plurality of semiconductor chips, a heat sink plate adhered to the plurality of semiconductor chips and covering each of the plurality of first heat spreaders, and a heat sink formed on the heat sink plate that dissipates heat to the exterior of the semiconductor package.

In still another embodiment, the invention provides a method of fabricating a semiconductor package that comprises adhering a semiconductor chip to a top surface of a substrate, adhering metal balls to a flat metal plate, forming a first heat spreader by cutting the flat metal plate in accordance with a size of an upper surface of the semiconductor chip, adhering the first heat spreader to the upper surface of the semiconductor chip, and adhering a ball terminal to a ball terminal land formed on a bottom surface of the substrate.

BRIEF DESCRIPTION OF THE DRAWINGS

Exemplary embodiments of the invention will be described in detail with reference to the attached drawings. Throughout the drawings, like reference symbols denote like or similar elements. In the drawings.

DETAILED DESCRIPTION OF THE INVENTION

When an element is described as being "on" or being formed "on" another element, it may be directly on or formed directly on that other element, respectively, or intervening elements may be present. Similarly, when an element is described as being adhered "to" another element, it may be adhered directly to that element, or intervening elements may be present. As used herein, the term "adhere" is not limited to the attaching of one element to another using an adhesive, but encompasses other methods of attaching one element to another as well.

Figure 1:
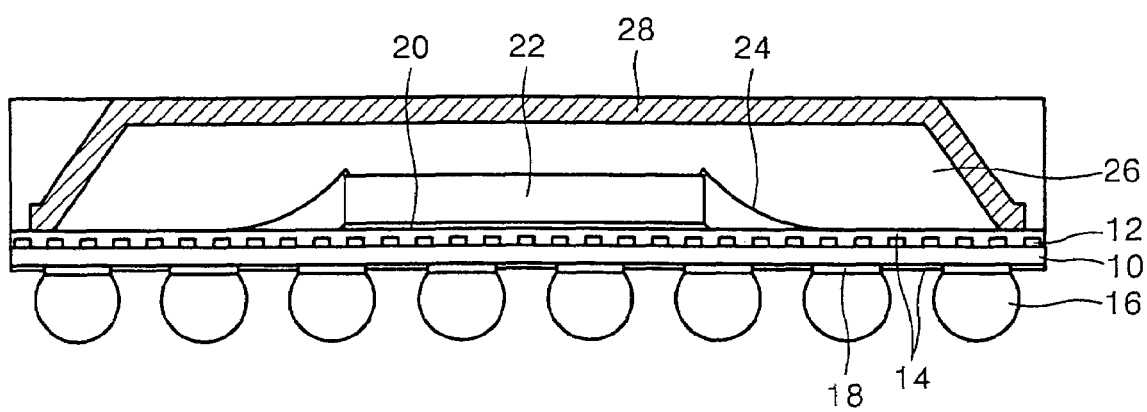
FIG. 1 is a cross sectional view of a semiconductor package comprising a conventional heat spreader.
Figure 2:
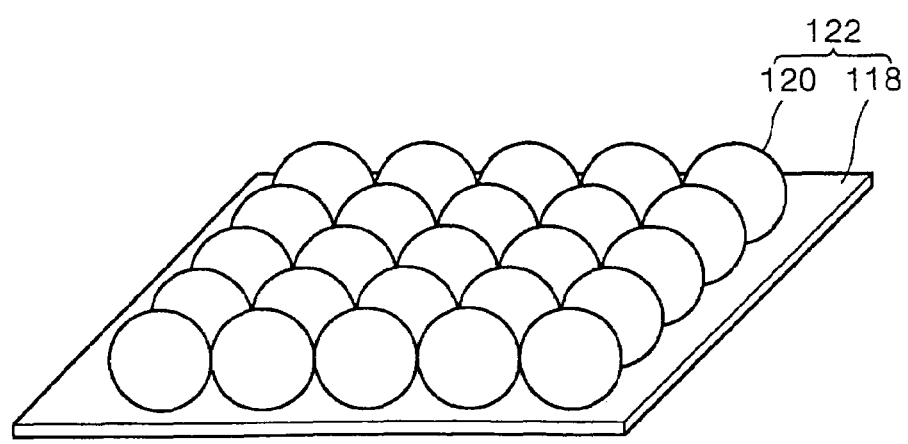
FIG. 2 is a perspective view of a first heat spreader 122 in accordance with an exemplary embodiment of the present invention.

FIG. 2 is a perspective view of a first heat spreader 122 in accordance with an exemplary embodiment of the present invention.

Referring to FIG. 2, first heat spreader 122 comprises a flat metal plate 118 and one or more metal balls 120.

Flat metal plate 118 may be formed from a material selected from the group consisting of Al, Cu, Au, Ag, Ni, and compounds thereof having relatively high heat conductivity. The heat conductivity of flat metal plate 118 is preferably above 300 W/mK. Metal balls 120 may be arranged so that they form a layer on a semiconductor chip 112 and the arranged metal balls 120 may be adhered to semiconductor chip 112 with an adhesive or an adhere film (not shown), through a metal bonding method, or through a reflow process.

Each metal ball 120 has an identical shape, and metal balls 120 may form a layer on flat metal plate 118. Preferably, each metal ball 120 has the shape of a solder ball because metal balls 120 should each have a maximum surface area and should be easily manufactured. In order to expand the path of heat dissipation, metal balls 120 are also preferably connected to each other such that they form a single body. Metal balls 120 may be formed into a single body through a reflow process.

Figure 8:
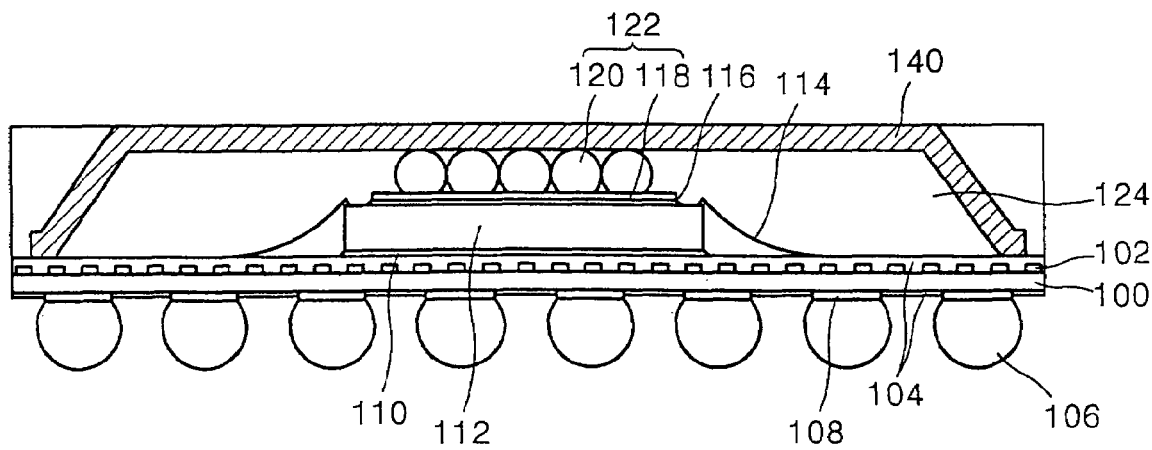
FIG. 8 is a cross sectional view of a semiconductor package comprising a first heat spreader 122 and a second heat spreader 140 in accordance with another exemplary embodiment of the present invention; and, FIG. 9 is a flowchart of a method of fabricating a semiconductor package in accordance with the exemplary embodiment illustrated in FIG. 8.

Metal balls 120 share a common diameter, which may vary in accordance with the type of package in which metal balls 120 are used. For example, in a find pitch BGA (FBGA) comprising first heat spreader 122, metal balls 120, each having a diameter of 0.3 mm, may be formed on flat metal plate 118 having a thickness of about 20 μm~about 40 μm to form an FBGA having a total height of 2.3 mm. As another example, metal balls 120, each having a diameter of 0.76 mm, may be formed on metal plate 118 having a thickness of 0.1 μm to form a plastic BGA (PBGA) having a total height of 2.5 mm, or to form a PBGA additionally comprising a second heat spreader 140 as shown in FIG. 8.

In this exemplary embodiment, the common diameter shared by metal balls 120 is about 0.2 mm to about 2.0 mm.

Also, a heat conductivity of the metal balls may be about 20 to 30 W/mK. However, in this exemplary embodiment, the heat conductivity of metal balls 120 is chosen in accordance with the package type and cost. The type, size, number, and/or arrangement of metal balls 120 may vary according to specific design considerations.

The present invention relates to a semiconductor package comprising a heat spreader, and exemplary embodiments of the invention will be described below. One exemplary embodiment of the present invention comprises first heat spreader 122 and another exemplary embodiment of the present invention comprises first heat spreader 122 and second heat spreader 140, which is a conventional, flat plate type heat spreader. A method of fabricating a semiconductor package comprising first heat spreader 122 and second heat spreader 140 is not limited by the related exemplary embodiment shown in FIG. 8 and can be modified in various ways.

Figure 3:
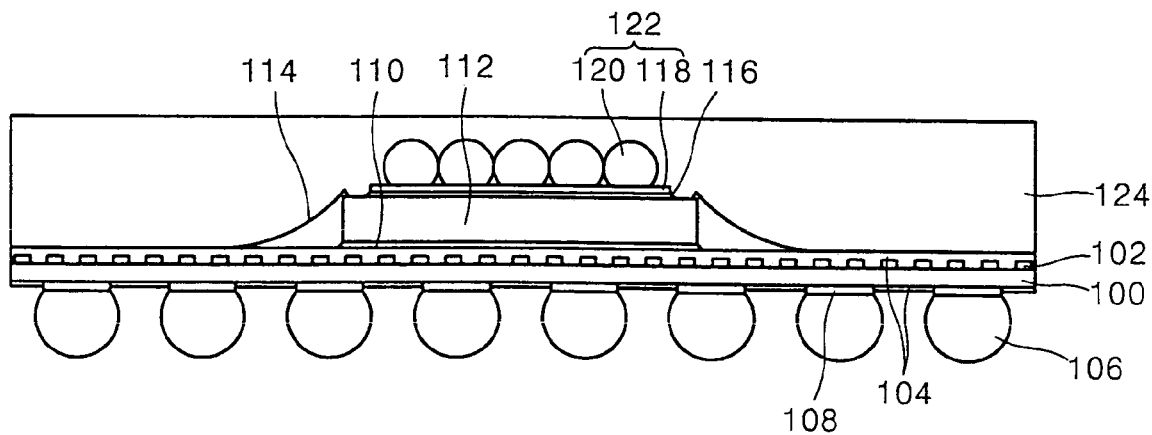
FIG. 3 is a cross sectional view of a semiconductor package comprising a first heat spreader in accordance with an exemplary embodiment of the present invention.

FIG. 3 is a cross sectional view of a semiconductor package comprising a first heat spreader in accordance with an exemplary embodiment of the present invention.

Referring to FIG. 3, the semiconductor package of this exemplary embodiment comprises a substrate 100, such as a printed circuit board (PCB). A semiconductor chip 112 is formed on a top surface of substrate 100. Both sides (i.e., both the top surface and a bottom surface) of substrate 100 may be coated with a passivation layer 104, such as a photo solder resist layer, except at an area where ball terminal lands 108 are formed. Semiconductor chip 112 is adhered to substrate 100 by an epoxy resin layer 110. Substrate 100 and semiconductor chip 112 are electrically coupled by a wire bonding 114. Reference symbol 102 denotes a generic illustration of a redistribution pattern. Redistribution pattern 102 electrically connects a plurality of bonding pads (not shown) of semiconductor chip 112 to ball terminal lands 108.

First heat spreader 122 comprises a plurality of metal balls 120 adhered to one side of a flat metal plate 118. The other side of flat metal plate 118 is adhered to an upper surface of semiconductor chip 112 by a non-metallic adhesive or a non-metallic adhere film 116. The upper surface of semiconductor chip 112 is preferably coated with a polyamide material. The non-metallic adhesive and non-metallic adhere film 116 may each comprise a conductive material. The package comprising first heat spreader 122 is molded with a molding material 124. Ball terminal lands 108 are formed on the bottom surface of substrate 100 and ball terminals 106 are adhered to ball terminal lands 108 in accordance with a conventional method.

Figure 4:
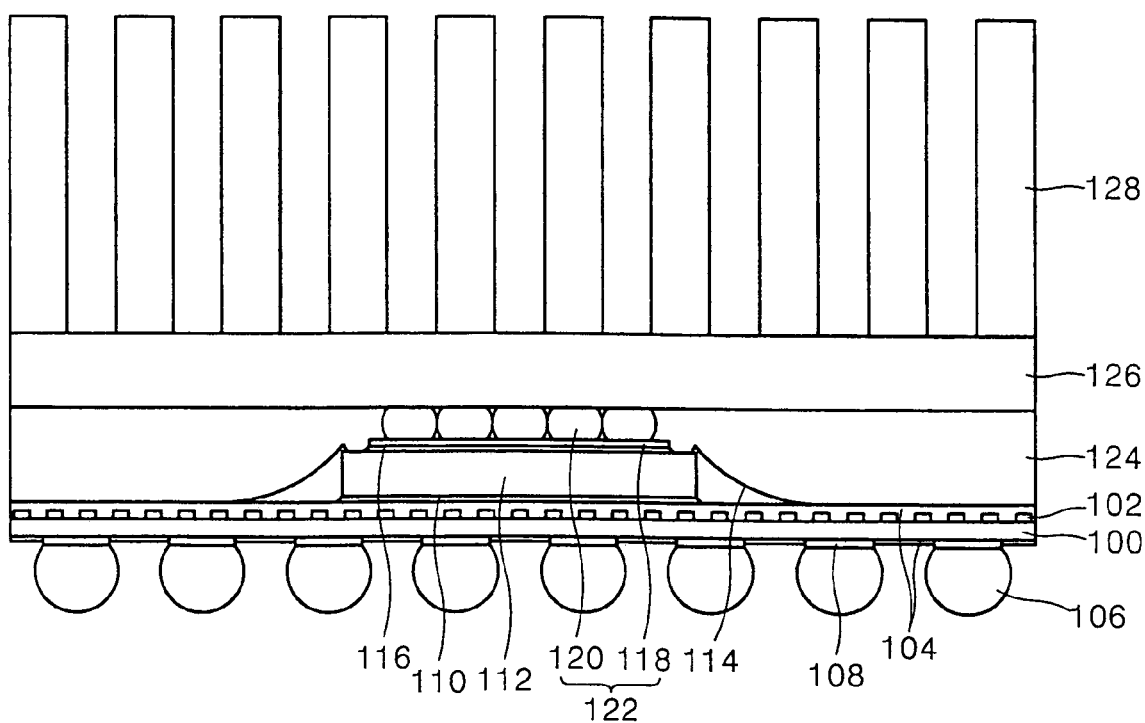
FIG. 4 is a cross sectional view of a semiconductor package comprising a heat sink plate 126 and a heat sink 128.

FIG. 4 is a cross sectional view of a semiconductor package comprising a heat sink plate 126 and a heat sink 128.

Referring to FIG. 4, first heat spreader 122 is formed on semiconductor chip 112, and an upper surface of first heat spreader 122 is exposed (i.e., not covered by molding material 124). One side of heat sink plate 126 is adhered to an upper surface of molding material 124 and covers first heat spreader 122, which is on semiconductor chip 112. The other side of heat sink plate 126 is adhered to heat sink 128, which dissipates heat to the exterior of the package.

Figure 5:
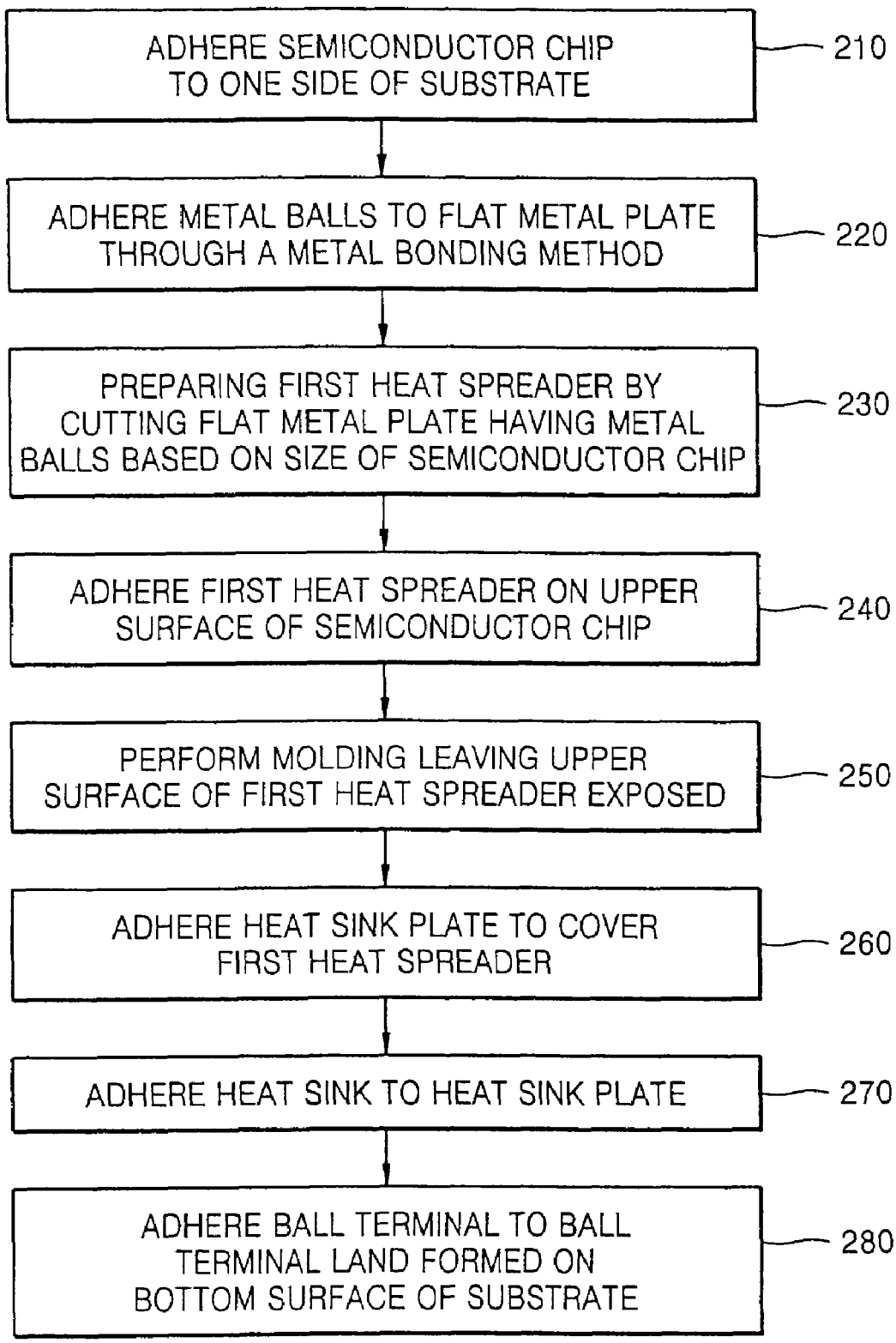
FIG. 5 is a flowchart of a method of fabricating a semiconductor package in accordance with the exemplary embodiment illustrated in FIG. 4.

FIG. 5 is a flowchart of a method of fabricating a semiconductor package in accordance with the exemplary embodiment shown in FIG. 4.

Referring to FIG. 5, semiconductor chip 112 is adhered to the top surface substrate 100 (210). Then, a plurality of metal balls 120 is adhered to metal plate 118 through a metal bonding method (220). First heat spreader 122 is prepared by cutting flat metal plate 118, to which metal balls 120 are adhered, based on the size of semiconductor chip 112 (i.e., in accordance with the size of the upper surface of semiconductor chip 112) (230). First heat spreader 122, as prepared in operation 230, is then adhered to the upper surface of semiconductor chip 112 (240). Next, semiconductor chip 112 and substrate 100 are molded with molding material 124, but the upper surface of first heat spreader 122 is left exposed (i.e., not covered by molding material 124) (250). In some cases, semiconductor chip 112 and substrate 100 may be molded to completely cover first heat spreader 122 with molding material 124. Heat sink plate 126 is formed on molding material 124 and first heat spreader 122 (260). That is, one side of the heat sink plate 126 covers molding material 124 and first heat spreader 122. Heat sink 128 is adhered to the other side of heat sink plate 126 (i.e., the side opposite the side of heat sink plate 126 that covers molding material 124 and first heat spreader 122) (270) and is adapted to efficiently dissipate heat to the exterior of the package. Ball terminals 106 are adhered to ball terminal lands 108, which are formed on the bottom surface of substrate 100 (280).

The temperature of the upper surface of semiconductor chip 112 of this exemplary embodiment may be about 3° C. to 7° C. lower than the upper surface of the conventional semiconductor chip. The temperature is measured by uniformly maintaining a temperature of 24° C. around the test area and flowing air at 3 m/sec through the test area. In this exemplary embodiment, the area of the upper surface of semiconductor chip 112 is about 5.5 mm×5.5 mm, the diameter of each metal ball 120 is about 0.5 mm, and the thickness of metal plate 118 is about 30 μm.

Figure 6:
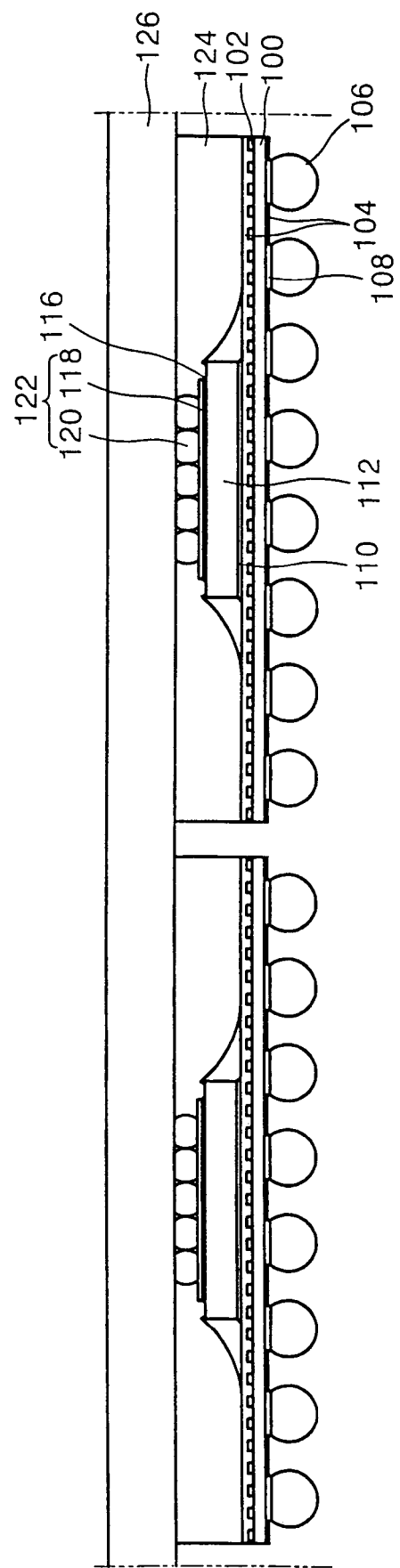
FIG. 6 is a cross sectional view of a portion of a semiconductor package module comprising a plurality of semiconductor chips of the exemplary embodiment illustrated in FIG. 4.
Figure 7:
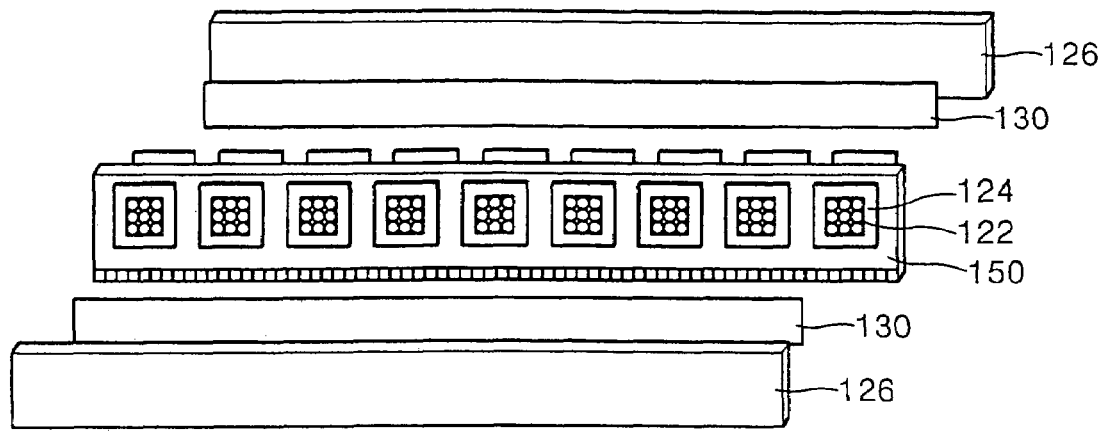
FIG. 7 is an exploded view of the semiconductor package module, a portion of which is illustrated by FIG. 6.

FIG. 6 is a cross sectional view of a portion of a semiconductor package module comprising a plurality of semiconductor chips 112 of the exemplary embodiment illustrated in FIG. 4, and FIG. 7 is an exploded view of the semiconductor package module, a portion of which is illustrated by FIG. 6.

Referring to FIGS. 6 and 7, the package module comprises a plurality of semiconductor chips 112, each of which is formed on a top surface of a substrate 100 of a plurality of substrates 100, wherein one of a plurality of first heat spreaders 122 is formed on the upper surface of each semiconductor chip 112. Each semiconductor chip 112 and the substrate 100 on which it is formed is molded with molding material 124, and the upper surface of each first heat spreader 122 is left exposed. Molding material 124 and each of the exposed first heat spreaders 122 are covered by one side of heat sink plate 126. Heat sink 128 is adhered to the other side of heat sink plate 126. Though it is omitted in FIG. 6, the exemplary embodiment of FIG. 6 comprises heat sink 128 as illustrated in FIG. 4. A heat conductive material 130, such as Ag, may be interposed between first heat spreaders 122 and heat sink plate 126 to contribute to the effective dissipation of heat by the semiconductor package module.

FIG. 7 is an exploded view of the semiconductor package module, which shows a plurality of first heat spreaders 122, each of which is adhered to a top surface of a semiconductor chip 112 (as shown in FIG. 6), wherein the semiconductor chips 112 are located on both sides of a module board 150. Heat sinks 126 are located on each side of module board 150, and optionally, heat conductive material 130 can be included between heat sink 126 and first heat spreaders 122.

FIG. 8 is a cross sectional view of a semiconductor package comprising first heat spreader 122 and second heat spreader 140 in accordance with another exemplary embodiment of the present invention. Semiconductor chip 112, substrate 100, and first heat spreader 122 of this exemplary embodiment are the same as those elements of the exemplary embodiment described with reference to FIG. 3.

Referring to FIG. 8, the semiconductor package of this exemplary embodiment comprises second heat spreader 140, which is a flat plate type heat spreader that covers side surfaces of semiconductor chip 112 and first heat spreader 122, and the upper surface of first heat spreader 122. Second heat spreader 140 is formed from a material having relatively high heat conductivity such as aluminum or copper and black-filmed by $CuO$ or $Cu_2O$ for maximizing the efficiency of heat dissipation. First heat spreader 122 may be contained completely inside molding material 124 or an upper surface of first heat spreader 122 may be exposed. If first heat spreader 122 is exposed, the exposed part of first head spreader 122 is preferably connected to an inside surface of second heat spreader 140. Though they are omitted in FIG. 8, the exemplary embodiment of FIG. 8 comprises both heat sink plate 126 and heat sink 128 as illustrated in FIG. 4.

FIG. 9 is a flowchart of a method of fabricating a semiconductor package in accordance with the exemplary embodiment illustrated in FIG. 8.

Referring to FIG. 9, operations 210 through 240 are performed as described with reference to FIG. 5. Then, semiconductor chip 112 and substrate 100 are molded with molding material 124 (300). Second heat spreader 140 is then formed covering side surfaces of semiconductor chip 112 and first heat spreader 122, and the upper surface of first heat spreader 122 (310). If a portion of the plurality of metal balls 120 of first heat spreader 122 is left exposed by molding material 124, the exposed portion of the plurality of metal balls 120 preferably contacts the inside surface of second heat spreader 140.

When, after forming second heat spreader 140, there is an exposed portion of first heat spreader 122 and that exposed portion contacts second heat spreader 140, the upper surface of second heat spreader 140 may be heated with an infrared ray. By heating the upper surface of second heat spreader 140, the portion of the plurality of metal balls 120 that is left exposed by molding material 124 is reflowed to firmly connect that exposed portion of the plurality of metal balls 120 to the inside surface of second heat spreader 140.

After operation 310, semiconductor chip 112 and substrate 100 are molded with the molding material 124, but the upper surface of second heat spreader 140 is left exposed (320). Heat sink plate 126 is then formed on molding material 124 and the exposed upper surface of second heat spreader 140 (330). That is, one side of heat sink plate 126 is adhered to molding material 124 and also covers the exposed upper surface of second heat spreader 140. Then, heat sink 128 is formed on heat sink plate 126 (340) so that heat may be efficiently dissipated to the exterior of the package. That is, heat sink 128 is adhered to the other side of heat sink plate 126 (i.e., the side opposite the side of heat sink plate 126 that was adhered to molding material 124). After forming heat sink 128, ball terminals 106 are adhered to ball terminal lands 108, which are formed on the bottom surface of substrate 100 (350).

In a semiconductor package comprising first heat spreader 122 and second heat spreader 140, as described above, the temperature of the upper surface of semiconductor chip 112 may be about 8° C. to 15° C. lower than the temperature of an upper surface of a semiconductor chip in a package that does not comprise first heat spreader 122 and second heat spreader 140. As described above, heat dissipation is greatly improved in the exemplary embodiment that comprises second heat spreader 140 combined with first heat spreader 122 as compared to a conventional device. The conditions used in measuring the temperature for this exemplary embodiment are identical to the previously described conditions that are used in measuring the temperature of the exemplary embodiment illustrated in FIG. 4.

In accordance with the previously described semiconductor package and the method of fabricating the same, a package comprising the first heat spreader adhered to the semiconductor chip has enhanced heat dissipation and effectively emits heat generated by the semiconductor chip to the exterior of the package.

Also, the heat dissipation of a semiconductor package is greatly improved over that of a conventional package by using the first heat spreader in combination with the conventional second heat spreader, and the resulting heat dissipation improvement outweighs the relative increase in package weight that accompanies using the second heat spreader.

The exemplary embodiments of the present invention described above utilize ball terminals, such as solder balls, but the invention is not limited to only the use of solder balls. Rather, it encompasses other types of ball terminals such as what are commonly referred to in the art as solder bumps. As used herein, the term "ball terminals" encompasses at least solder balls, solder bumps, and equivalent structures.

While the present invention has been particularly shown and described with reference to exemplary embodiments of the invention, it will be understood by those of ordinary skill in the art that various changes in form and detail may be made therein without departing from the scope of the present invention as defined by the following claims.

What is claimed is:

1. A semiconductor package, comprising:
a substrate having top and bottom surfaces;
a semiconductor chip formed on the top surface of the substrate;
a ball terminal land formed on the bottom surface of the substrate;
a first heat spreader adhered to an upper surface of the semiconductor chip and comprising; a flat metal plate, and a plurality of metal balls arranged on the flat metal plate; and,
a ball terminal adhered to the ball terminal land.

2. The semiconductor package of claim 1, wherein the metal balls are arranged on the flat metal plate so that the metal balls form a layer.

3. The semiconductor package of claim 2, wherein the flat metal plate is formed from a material selected from the group consisting of Al, Cu, Au, Ag, Ni and compounds thereof.

4. The semiconductor package of claim 2, wherein the flat metal plate is adhered to the upper surface of the semiconductor chip by a non-metallic adhesive.

5. The semiconductor package of claim 1, wherein side surfaces of the metal balls are connected to each other such that the metal balls form a single body.

6. The semiconductor package of claim 1, wherein a diameter of each metal ball is about 0.2 mm to about 2.0 mm.

7. The semiconductor package of claim 1, wherein a heat conductivity of each metal ball is about 20 W/mK to about 30 W/mK.

8. The semiconductor package of claim 1, wherein the metal balls are bonded to the flat metal plate.

9. The semiconductor package of claim 1, wherein the metal balls are adhered to the flat metal plate by an adhesive.

10. The semiconductor package of claim 1, further comprising:
a molding material, wherein the molding material covers the semiconductor chip and the first heat spreader except at an upper surface of first heat spreader;
a heat sink plate adhered to the molding material and covering the first heat spreader; and,
a heat sink adhered to the heat sink plate.

11. The semiconductor package of claim 1, further comprising a second heat spreader that covers side surfaces of the semiconductor chip and the first heat spreader, and an upper surface of first heat spreader, wherein the second heat spreader is a flat plate type heat spreader.

12. The semiconductor package of claim 11, wherein an inside surface of the second heat spreader contacts a molding material, wherein the molding material covers the entire first heat spreader.

13. The semiconductor package of claim 11, wherein the inside surface of the second heat spreader contacts a molding material, wherein the molding material covers the first heat spreader except at an upper surface of the first heat spreader.

14. The semiconductor package of claim 13, wherein the exposed upper surface of the first heat spreader contacts an inside surface of the second heat spreader.

15. A semiconductor package module, comprising:
a plurality of semiconductor chip packages, each comprising a semiconductor chip and a first heat spreader adhered to the semiconductor chip, wherein the first heat spreader comprises a metal plate and a plurality of metal balls arranged on the metal plate;
a heat sink plate adhered to the plurality of semiconductor chip packages via the first heat spreaders associated with the plurality of chip packages; and,
a heat sink formed on the heat sink plate.

16. The semiconductor package of claim 15, further comprising a heat conductive material interposed between the first heat spreaders and the heat sink plate.

17. A semiconductor package, comprising:
a semiconductor chip disposed on a substrate; and
a first heat spreader disposed on the semiconductor chip and comprising a metal plate and a plurality of metal balls disposed on the metal plate.

18. The semiconductor package of claim 17, wherein the metal balls are arranged on the metal plate in a layer.

19. The semiconductor package of claim 17, further comprising:
a molding material covering the semiconductor chip and the first heat spreader, except an exposed surface of first heat spreader;
a heat sink plate thermally connected to the exposed surface of the first heat spreader; and
a heat sink thermally connected to the heat sink plate.

20. The semiconductor package of claim 17, further comprising:
a molding material covering the semiconductor chip and the first heat spreader, except an exposed surface of first heat spreader;
a second heat spreader disposed on the substrate to cover the semiconductor chip and thermally connected to the exposed surface of the first heat spreader.

* * * * *